United States Patent
Palisetti

(10) Patent No.: US 7,870,521 B2
(45) Date of Patent: Jan. 11, 2011

(54) METHOD OF DESIGNING AN ELECTRONIC DEVICE AND DEVICE THEREOF

(75) Inventor: Vasant Palisetti, Santa Clara, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 314 days.

(21) Appl. No.: 12/038,010

(22) Filed: Feb. 27, 2008

(65) Prior Publication Data

US 2009/0217220 A1 Aug. 27, 2009

(51) Int. Cl.
*G06F 17/50* (2006.01)
(52) U.S. Cl. ............................................. 716/4; 716/5
(58) Field of Classification Search .................. 716/4–6
See application file for complete search history.

(56) References Cited

U.S. PATENT DOCUMENTS

| 6,345,379 | B1 * | 2/2002 | Khouja et al. ................... 716/4 |
| 7,131,078 | B1 * | 10/2006 | Maheshwari et al. ........... 716/3 |
| 7,475,366 | B2 * | 1/2009 | Kuemerle et al. ............... 716/1 |
| 7,627,836 | B2 * | 12/2009 | Culp et al. ...................... 716/2 |

* cited by examiner

*Primary Examiner*—Jack Chiang
*Assistant Examiner*—Binh C Tat

(57) ABSTRACT

A plurality of sequential nodes in a design file for an electronic device are identified and an effective switching capacitance is determined for a first sequential node of the plurality of sequential nodes based upon statically predicted operation of a first device downstream from the first sequential node. The effective switching capacitance for the first sequential node is stored, and the process is repeated for the other identified sequential nodes in the design file.

18 Claims, 4 Drawing Sheets

METHOD OF DESIGNING AN ELECTRONIC DEVICE AND DEVICE THEREOF

BACKGROUND

1. Field of the Disclosure

The present disclosure relates generally to electronic devices and more specifically to the design of electronic devices.

2. Description of the Related Art

Reduction of power consumption in electronic devices, such as integrated circuit devices formed at a common semiconductor substrate, is desirable, especially for devices targeted for low-power applications, such as battery-powered applications. Therefore, it is desirable to focus on portions of a design that consume relatively high amounts of power, as compared to other portions of the design, to reduce the overall power consumption of the device by further optimizing their design or layout characteristics. Prior techniques of determining the amount of power consumed by a portion of a device, to determine if it should be focused upon for further power reduction, have included estimating the amount of power consumed by each of these portions. Such power estimations can be dynamically determined or statically determined. For example, power consumption at a specific portion of a design has been estimated by simulating the device based upon known input vectors and determining the resultant power consumption.

The prior methods of estimating power consumption of various blocks can occur late in the design process of a device and be computationally intensive. Therefore, a method that would allow for determining which portions of a design should be optimized for power consumption early in the design process, or that is less computationally intensive would be useful.

DETAILED DESCRIPTION

A system and methods are disclosed to implement a design tool to efficiently prioritize circuit nodes of an electronic device facilitating a designer to focus effort on high power portions of the design. This is accomplished by calculating the effective switching capacitance at selected circuit nodes. These methods are useful throughout the product development schedule, and are especially useful early in the design process before committing significant implementation resources. The circuit nodes for which the effective switching capacitance is calculated can be the enable nodes connected to coarse or fine clock gaters. The clock gaters are used in the design to temporarily prevent portions of the design from storing or transmitting data, and thereby reduce the total power dissipated by the design.

Figure 1:
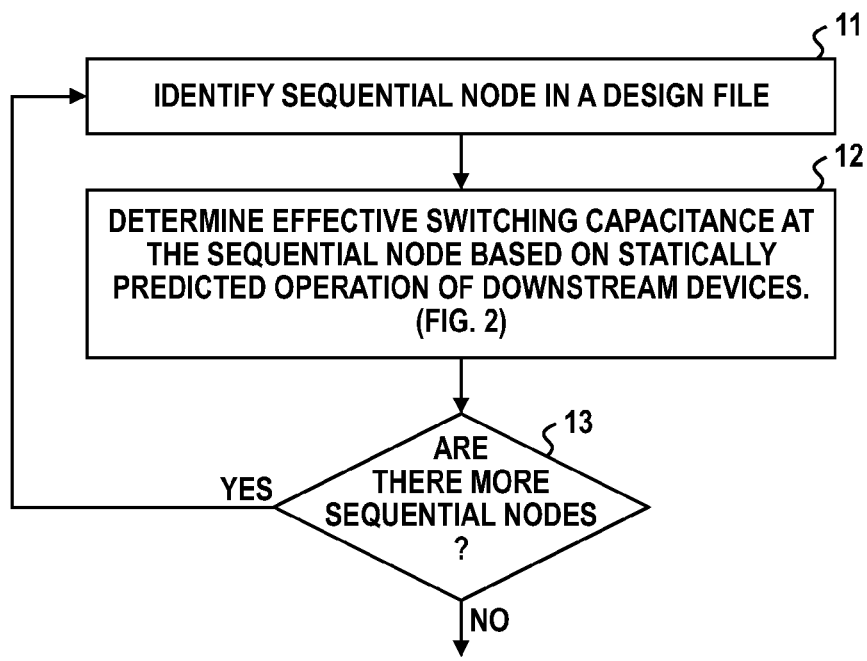
FIG. 1 illustrate a method in accordance with a specific embodiment of the present disclosure.

FIG. 1 is a flow chart illustrating a design tool method that can be used to identify a plurality of sequential nodes in the design file, and for each, determining the effective switching capacitance associated with said node based on the statically predicted operation of downstream devices. The criteria by which a device qualifies as a downstream device will be better understood with regard to FIG. 2. The operation of each downstream device is predicted statically, that is, without employing input vectors to simulate actual operation of the device. Predicting the switching behavior of a device statically allows switching analysis to be conducted much earlier in the development process when test vectors with suitable test coverage or simulation infrastructure are not available.

Referring to FIG. 1, Block 11 represents the process of identifying a sequential node in a design file. Block 12 represents the process of determining the effective switching capacitance associated with the sequential node identified in block 11. A specific implementation of block 12 is further illustrated at FIG. 2. Decision block 13 determines whether there are more sequential nodes in the design file for which the effective switching capacitance must still be determined. If there are more sequential nodes, then the procedure returns to block 11. If there are no remaining sequential nodes in the design file to process, the flow exits.

A sequential node of the design file can include any input or output of a sequential device or any node that gates a signal, such as a clock, that is provided to a sequential device, to enable or disable propagation of information through the sequential device. For example, referring to FIG. 4, which illustrates a design file representing an electronic device 100, devices 110-117 are sequential devices and nodes 120-124 are examples of some of the sequential nodes. Sequential nodes of interest can be identified by the designer, or can be automatically identified by a suitable signal node naming convention, or component naming convention. It will be appreciated that a design file is a symbolic representation of the electronic device under evaluation and can contain information including the connectivity of the devices in the design, information about the logic function and electrical characteristics of the devices, and information about the capacitance at the interconnecting nodes.

The effective switching capacitance for a sequential node, as determined at block 12 of FIG. 1, is an estimate of how much capacitance downstream from the sequential node is charged and discharged during a clock cycle. It will be appreciated that not all devices downstream from a node, such as a sequential node, will switch during a clock cycle, and that the probability that a particular device will switch is based on the logic function of the devices upstream from the device. The effective switching capacitance at a node is based upon this switching probability.

Figures 2, 3:
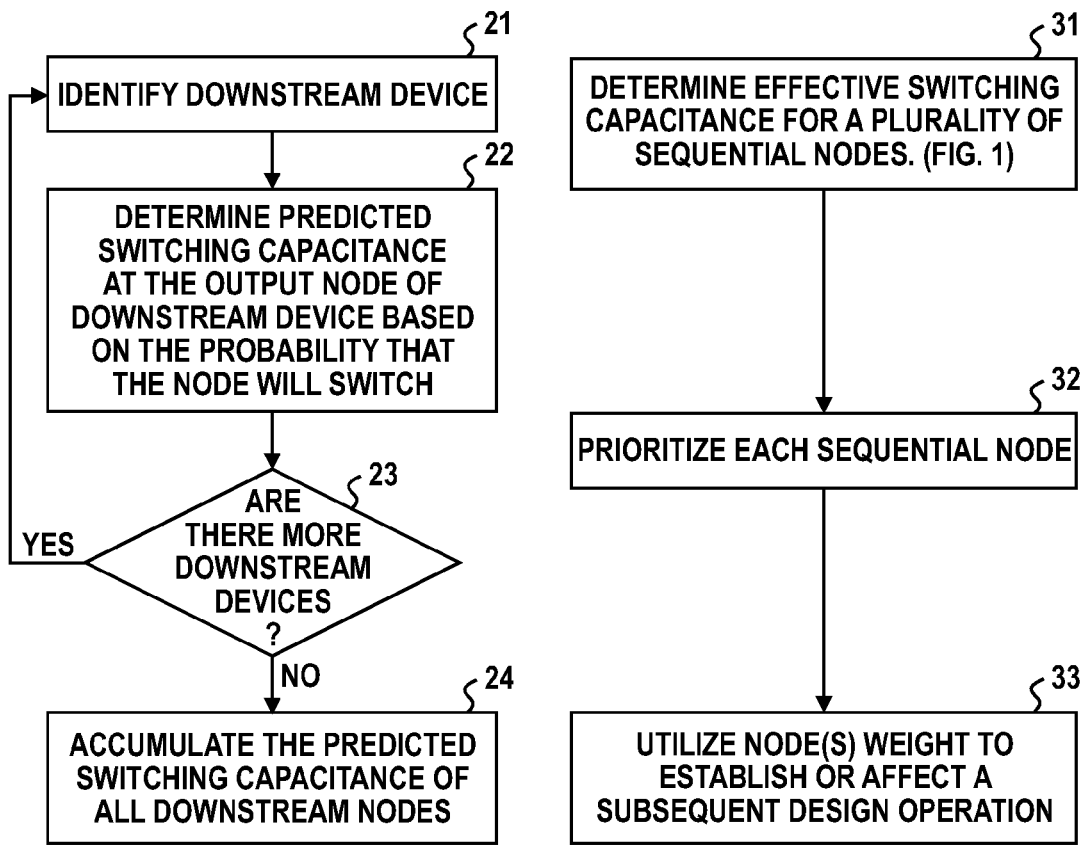
FIG. 2 illustrate a method determining a switching capacitance as identified in the method of FIG. 1 in accordance with a specific embodiment of the present disclosure.
FIG. 3 illustrates a method of in accordance with a specific embodiment of the present disclosure.

FIG. 2 is a flow chart illustrating a procedure for determining the effective switching capacitance at a sequential node by identifying qualifying downstream devices, and determining the predicted switching capacitance at the output of each qualified device based on the statically determined probability that the device will switch in any given clock cycle. A device is said to switch when its output or outputs transition from a logic low state to a logic high state, or from a logic high state to a logic low state.

Block 21 of FIG. 2 represents the process of identifying a device downstream from the sequential node identified at block 11 of FIG. 1. At block 22, the predicted switching capacitance at the output nodes of the downstream devices identified in block 21 are calculated based on the statically predicted probability that said node switches. The completion of block 22 flows into the decision block 23. Decision block 23 determines if any additional devices downstream from the sequential node needs to be considered. If further devices remain to be considered, then the flow proceeds back to block 21. If no additional devices need to be considered, then the flow proceeds to block 24 where the predicted switching capacitance at all nodes downstream of the sequential node are accumulated together, the sum representing the effective switching capacitance associated with the sequential node.

Figure 7:
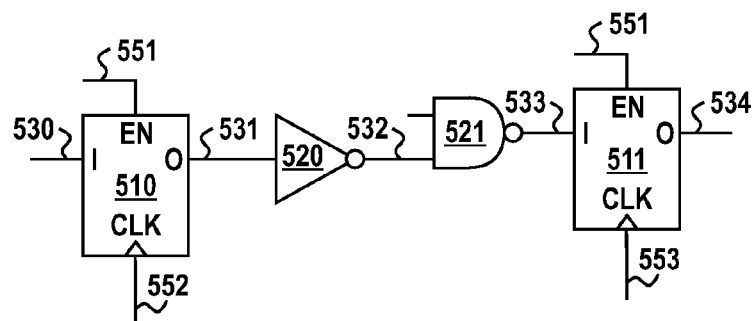
FIG. 7 illustrates a representative portion device representative device represented by a design file.

For the purposes of this disclosure, a device is considered downstream of a sequential node when the ability of said downstream device to switch is contingent upon a logic value at said sequential node, such as based upon the logic state of a node that is connected to an enable input of a sequential device to provide an enable signal, or contingent upon a change in logic state of said sequential node, such as based upon the logic state of a node that is connected to a clock or latch input of a sequential device to provide a clock or latch signal. Referring ahead to FIG. 7, devices 510 and 520-521 are considered downstream of sequential node 551. Device 511 is also considered downstream from node 551 since its ability to switch is also contingent upon the logic value of sequential node 551.

Referring further to FIG. 7, the output terminal of each downstream device is connected to a node and said node will possess a total capacitance that can include the interconnect capacitance associated with said node, referred to as the wire capacitance, as well as the input capacitance of all devices that receive data from said node. The total capacitance at a node can also include the capacitance internal to the output terminal of a device whose output is connected to said node. For example, the total capacitance at node 531 can include the wire capacitance at node 531 as well as the input capacitance of device 520. There is a total capacitance associated with the enable node 551 as well, consisting of the wire capacitance at node 551 as well as the input capacitance of device 510. Early in the design implementation process, some or all of the constituent elements comprising the total capacitance may not yet be fully known, and estimates can be used for said elements. For example, if precise physical routing of a node is not yet available, the wire capacitance can be based on an estimated wire length provided by a design floor plan or by an estimated fixed wire length. The total capacitance at a node can also be based only upon a fanout of said node, where the fanout is a function of how many device inputs are connected to said node.

The probability that a downstream device will switch can be determined statically by evaluating the logical function performed by said device and all devices upstream of said device. Referring to FIG. 7, node 532 will always switch when node 531 switches because device 520 is an inverter and there are no additional devices upstream, between sequential device 510 and device 520. Node 533, however, will statistically switch only half as often as node 532 switches, since it is the result of a two-input NAND device. The switching probability of a device will be discussed in more detail herein. Based upon the switching probability of each downstream device, the effective switching capacitance associated with node 551 is a function of the total capacitance at node 551, the total capacitance at node 531, the total capacitance at node 532, and one half of the total capacitance at node 533. The portion of a node's total capacitance that will be included in the effective switching capacitance calculation is based on the probability that the node will switch during any clock cycle.

Figure 8:
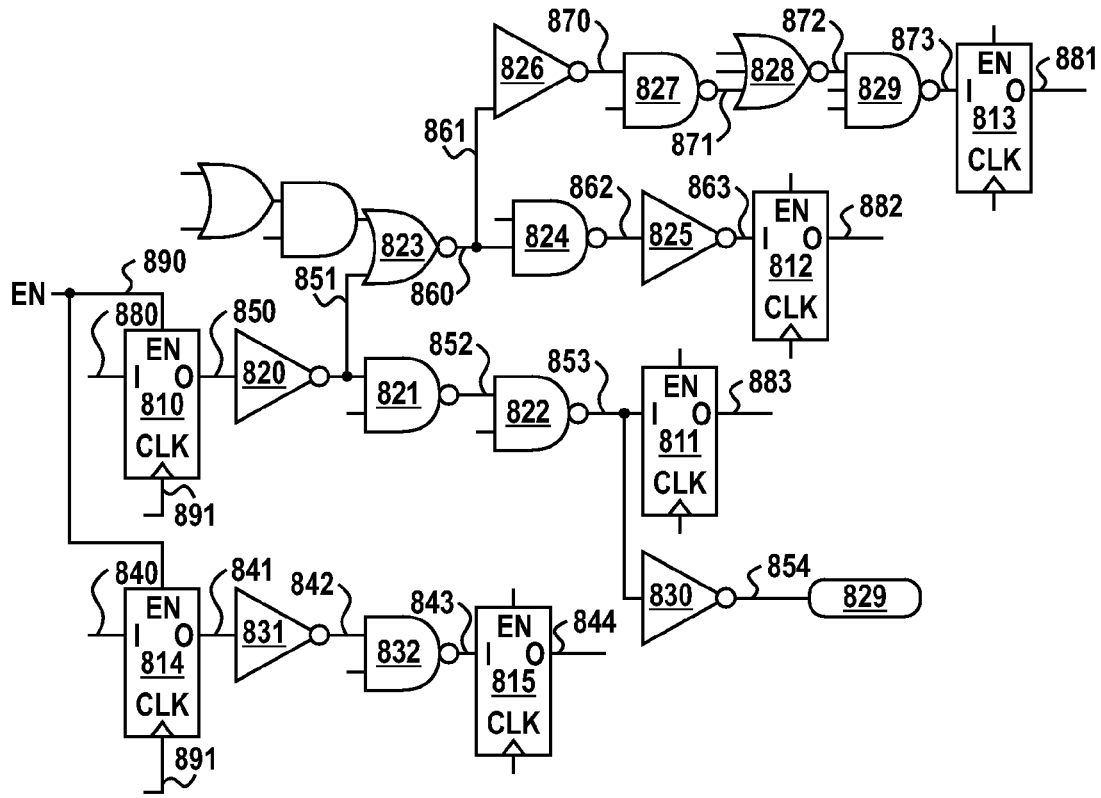
FIG. 8 illustrates a representative portion device representative device represented by a design file.

Referring ahead to FIG. 8, the effective switching capacitance associated with enable node 890, is a function of the total capacitance at nodes 890, 850-854, 860-863, 870-873, and 841-843, and of the respective switching probability of each of these nodes. The probability that node 851 will switch when node 850 switches is 100%. The probability that node 852 will switch when node 851 switches is 50%. The probability that node 853 will switch when node 852 switches is also 50%, therefore, the probability that node 853 will switch as a result of node 850 switching, is only 25%. The probability that node 854 will switch as a result of node 850 switching is also 25%, since the switching probability of inverter 830 with respect to node 853 is 100%. It can be seen that the probability that a signal at a downstream node will switch is based upon how far downstream the node is located and by the logic function performed by devices upstream from said node.

Referring further to FIG. 8, the total effective switching capacitance at node 890 includes the total capacitances at downstream nodes derated by their switch probability. For example, the effective switching capacitance at node 890 includes the total capacitance at nodes 850 and 851, one half of the total capacitance at node 852, one quarter of the total capacitance at node 853, and one quarter of the total capacitance at node 854. Capacitance from other downstream nodes can be included as well, the total node capacitance at each included node scaled by their corresponding switching probability.

FIG. 3 is a flow chart that illustrates prioritizing, weighting, or otherwise normalizing the plurality of sequential nodes based upon their effective switching capacitances, followed by the utilization of said weighting to establish or affect other design operations.

Block 31 represents the process of determining the effective switching capacitance for a plurality of sequential nodes of interest as discussed with reference to FIG. 1. At block 32 additional computations can be employed to prioritize the sequential nodes analyzed in block 31. The completion of block 32 flows into block 33, where other design operations can be undertaken or affected, based on the prioritization performed in block 32. These operations can include manual design optimization or can include the use of additional design tools and algorithms where the behavior of said tools or algorithms is affected by the results of block 32.

In one embodiment, a priority ranking of the plurality of sequential nodes can be based on how much each node contributes to the total effective switching capacitance at all sequential nodes under evaluation in the design.

The results of the procedures disclosed can be used to establish or affect other operations in the design process. Prioritizing enable nodes of an electronic device by employing a weighting system can allow designers to concentrate on logic areas of the device that can yield higher returns in terms of power reduction for resources invested. For example, the results can be used to guide the redesign of the course and fine gater enable logic structure. The results can be used to select one sequential node based upon its effective switching capacitance, and initiate a layout operation, such as a floor planning, physical placement of device, and routing of connections between devices, based upon its selection to optimize device locations and to minimize routing length for nodes downstream from a sequential node with a high effective switching capacitance. The results can be used to support manual or automated logic device substitution algorithms such as consolidating logic devices into more complex logic devices, thus lowering the switching probability of downstream nodes. Other optimization operations can include advising device down-sizing algorithms. The operations described are only examples of the many such operations than can be undertaken.

The following information will elaborate and further illustrate the matters previously described.

Figure 4:
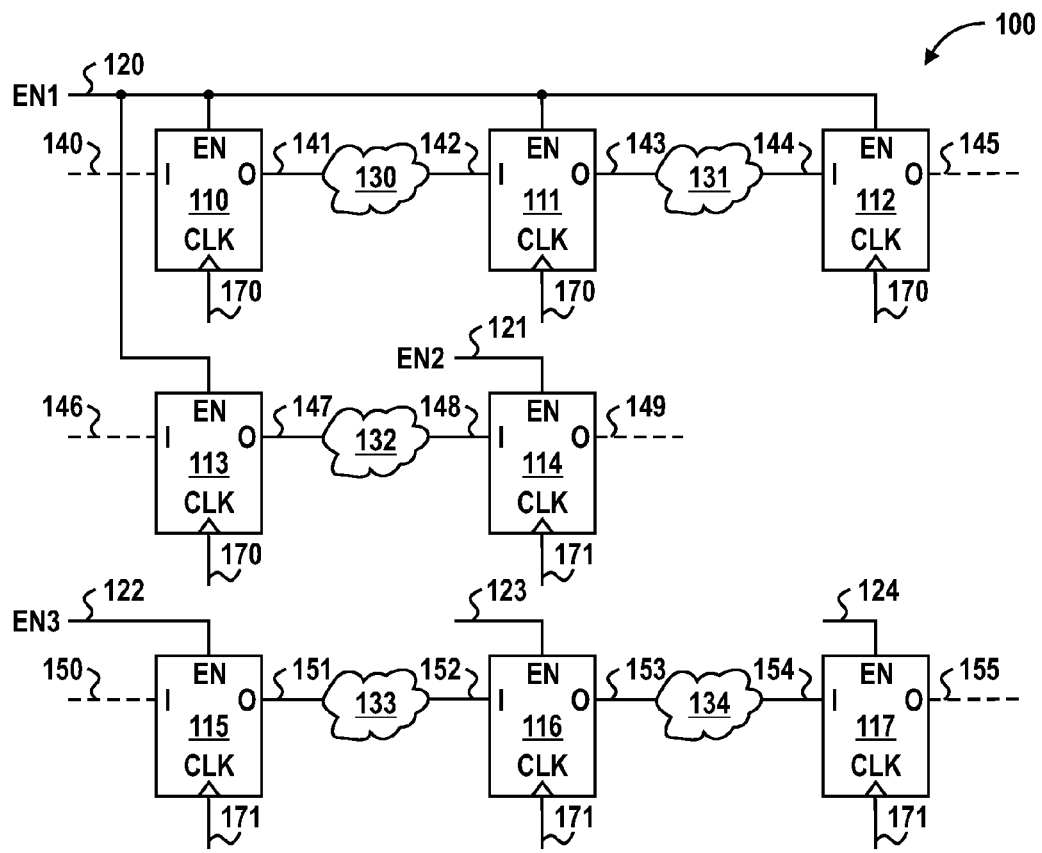
FIG. 4 illustrates a representative portion of device representative device represented by a design file.

FIG. 4 illustrates a block diagram representing a portion 100 of an electronic design and includes latches 110-117, and logic clouds 130-134.

Latch 110 has a data input connected to node 140, a data output connected to node 141, an enable input connected to node 120, and a clock input connected to node 170. Logic cloud 130 includes a data input connected to node 141 and a data output connected to node 142. Latch 111 has a data input connected to node 142, a data output connected to node 143, an enable input connected to node 120, and a clock input connected to node 170. Logic cloud 131 includes a data input connected to node 143 and a data output connected to node 144. Latch 112 has a data input connected to node 144, a data output connected to node 145, an enable input connected to node 120, and a clock input connected to node 170. Latch 113 has a data input connected to node 146, a data output connected to node 147, an enable input connected to node 120, and a clock input connected to node 170. Logic cloud 132 includes a data input connected to node 147 and a data output connected to node 148. Latch 114 has a data input connected to node 148, a data output connected to node 149, an enable input connected to node 121, and a clock input connected to node 171. Latch 115 has a data input connected to node 150, a data output connected to node 151, an enable input connected to node 122, and a clock input connected to node 171. Logic cloud 133 includes a data input connected to node 151 and a data output connected to node 152. Latch 116 has a data input connected to node 152, a data output connected to node 153, an enable input connected to node 123, and a clock input connected to node 171. Logic cloud 134 includes a data input connected to node 153 and a data output connected to node 154. Latch 117 has a data input connected to node 154, a data output connected to node 155, an enable input connected to node 124, and a clock input connected to node 171.

FIG. 4 also includes a signal EN1 which is provided to node 120 and which is received at the enable input (EN) of latch 110-113. Signal EN2 is provided to node 121 and is received at the enable input of latch 114. Signal EN3 is provided to node 122 and is received at the enable input of latch 115.

The logic clouds 130-134 contain one or more non-sequential logic gates, such as static or dynamic combinatorial logic gates. The one or more non-sequential logic gates provide at least one data input and one data output to the logic cloud.

FIG. 4 is intended to represent a general interconnection of latches and non-sequential devices as represented by a design file. Whereas latches are used to represent sequential devices at FIG. 4, it will be appreciated that other sequential devices having clock inputs that can be gated can be used as well, including but not limited to flip-flops. The signals EN1, EN2, and EN3 represent any number of enable signals that can be received by any number of latches. Nodes 170 and 171 are connected to the clock input of the latches as shown, however for the purpose of this disclosure, one of any number of nodes can be connected to any latch clock input. It will be appreciated that while the logic clouds 130-134 are illustrated to have a single data input and a single data output, that there can be additional inputs and outputs. Any device having a data input whose connection is not explicitly shown, such as the input at device 521 of FIG. 7, can be connected to a data output of another device or can be connected to a primary input of the overall design. Any device having a data output whose connection is not explicitly shown can be connected to the data input of one downstream device or multiple downstream devices, or to a primary output of the overall design.

Herein, the term 'clock event' refers to an active assertion on the clock input of the sequential device, which will cause said device to update its internal logic state dependent upon the logic value applied to its corresponding data input. Depending on the type of sequential device, the clock event might be 1) a transition of the clock, either rising or falling, such as that utilized by an edge sensitive latch, or 2) a specific logic state, a logic high or a logic low, such as utilized by a level sensitive latch. When the internal logic state of the sequential device changes, so will its data output(s).

FIG. 4 illustrates latches 110-117. In the specific embodiment illustrated, latches are used to illustrate sequential devices. The latches 110-117 can store the value present on a data input (I) following a clock event on a clock input (CLK). The latches 110-117 also include a data output (O) that represents the value stored in the latch. Each of these latches 110-117 also includes an enable input (EN) that further qualifies whether the latch will store the value present on the data input during the clock event. If the signal received at the enable input is active, then the state of the latch will be updated as a result of a clock event. If the signal received at the enable input is inactive, then the state of the latch will not be updated as a result of a clock event. Wherein reference is made to the latches having a single data input, it should be understood that an alternative sequential device can have more than one data input that encodes the value that is stored within the device. The sequential devices can also have more than one data output that can change state as a result of a clock event.

Figure 5:
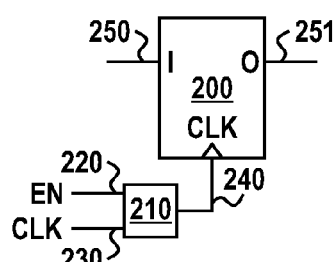
FIG. 5 illustrates a representative portion device representative device represented by a design file.

FIG. 5 illustrates how a clock signal CLK, provided to node 230 of device 210, can be gated by an enable signal EN, provided to node 220 of device 210, producing a gated clock signal that is provided to node 240. Node 240 provides the gated clock signal to the clock input of latch 200. The signal EN will gate (allow or prevent) the propagation of the clock signal onto node 240. When the enable input of device 210 is in the inactive state, node 240 is prevented from being asserted, and the logic value present on the data input of latch 200 (node 250) will not be stored by the latch. Conversely, if the enable input is set to the active state, then node 240 will be asserted and the value present on the data input of the latch will be stored by the latch. Because each of nodes 220, 230, 240, 250, and 251 either controls a clock provided to latch device 200, or their change in state controls switching activity downstream from latch 200, they are considered sequential nodes as previously discussed.

Figure 6:
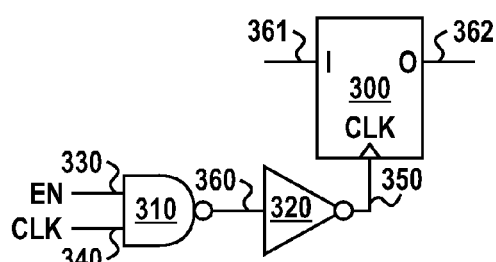
FIG. 6 illustrates a representative portion device representative device represented by a design file.

FIG. 6 includes one of any number of circuits that can achieve the function of component 210 in FIG. 5. In this example, the inputs of a NAND gate 310 receive an enable signal EN at node 330, and a clock signal CLK at node 340. The output of the NAND device is connected to the data input of an inverter device. The data output of the inverter is connected to node 350 and drives the CLK input of latch 300. Node 350 can be referred to as a gated clock node. The behavior of the circuit illustrated at FIG. 6 is functionally similar to that previously described for FIG. 5. Any number of other circuits can achieve the same goal of gating a clock signal. Variations can include the use of multiple enabling or qualifying signals and multiple clock signals. The circuit creating the gated clock signal, i.e., the NAND gate 310, will be herein referred to as a clock gater. Nodes 330, 340, 360, 350, 361, and 362 can all be considered to be sequential nodes associated with latch 300.

Throughout this disclosure, reference to an enabling signal can include a signal received at the enable input of a latch, or to the enabling input of a clock gater circuit such as those shown in FIG. 5 and FIG. 6. In either case, the enabling node is considered one of the sequential nodes associated with a sequential device.

FIG. 7, illustrates two latches 510 and 511, an inverter 520, and a NAND device 521. The data output of latch 510 is connected to node 531. The data input of inverter 520 is connected to node 531 and its data output is connected to node 532. One data input of NAND device 521 is connected to node 532 and its output connects to node 533. Node 533 is connected to the data input of latch 511. Devices 520 and 521 are considered downstream of device 510. In one embodiment, latch 510 can represent latch 113 of FIG. 4, latch 511 can represent latch 114 of FIG. 4, and inverter 520 and NAND device 521 can represent the logic cloud 132 of FIG. 4.

How the statistical likelihood of a node switching is dependant on the logical function performed by the device driving said node is discussed with reference to FIG. 7. Each node downstream from latch 510, nodes 531, 532, and 533, has associated with them a respective total capacitance. Node 532 will always switch when node 531 switches. Node 533 has a statistical likelihood of switching of 50 percent due to the logic function of the NAND device. The statistical likelihood of a device switching will be referred to as a switch fraction (SF). The switch fraction for any arbitrary device can be calculated by the following equation:

$$SF=(2*NL1*NL0)/(2^n*(2^n-1))$$

SF is the switch fraction for a logic device driving a specific node under consideration. Variable NL0 is the number of input states that result in the output assuming a logic-zero state. Variable NL1 is the number of input states that result in the output assuming a logic-one state. Variable n is the number of inputs of the logic device. For a combinational device with 'n' inputs, the total number of possible input states (S0, S1 ..., Sn−1) are $2^n$. The total possible input state transitions, S0->S1, S2, ... Sn−1 or S1->S0, S2 ..., Sn−1, is $(2^n*(2^n-1))$.

Again referring to FIG. 7, as a result of a clock event on node 552, the output of latch 510 will switch depending on the values asserted on the latch data input (connected to node 530) and upon the value asserted on the latch enable input (connected to node 551). If node 531 switches, then node 532 will also switch because device 520 in an inverter and the switch fraction of an inverter is 1.0. Based on the switch fraction equation, node 533 will switch 50% of the time that node 532 switches because NAND device 521 has a switch fraction of 0.5. It will be appreciated that the probability that a node will switch relative to a signal switching at a latch output can decrease depending on how far downstream from the latch output that said node resides. The switch probability 'd' represents the probability that the output of a device(x) driving a node being evaluated will switch in response to a signal switching at the upstream latch, and is dependent upon the probability that an input signal to the device(x) will switch. This is represented by the equation:

$$d_X=SF_X*d_{X-1}$$

Value $d_X$ is the switch probability at the output of device(x). Variable $SF_X$ is the switch fraction of device(x). Variable $d_{X-1}$ is the switch probability at the input of device(x) as determined at the output of a device(x−1) driving the device(x). Therefore, the statically predicted switching operation of a downstream device is a function of the switch probability of nodes upstream from the device.

There is a property associated with a device, which will herein be referred to as the internal switching factor, ISF. The internal switching factor relates to how efficiently an output of a device can switch and is typically measured during the characterization process for each device in a design component library by monitoring the crossover current within the device when the device switches. The crossover current of the device is a function of the capacitive load connected to the output of the device and can have the apparent effect of increasing the total capacitance at said capacitive load. Prior to the availability of a characterized component library, a default value for ISF can be used for each device, such as a value of 0.3 to 0.4.

The effective switching capacitance at an output of a sequential device is the sum of the predicted switching capacitance on the nodes connected to the outputs of all qualifying devices downstream from said output, taking the statically predicted switching probability of each downstream device into consideration. The effective switching capacitance EC as calculated at the data output of latch 510 for a sequential node, such as node 551, can be represented by the following equation:

$$EC=(1+ISF_0)*C_0+(1+ISF_1)*C_1*d_1+(1+ISF_2)*C_2*d_2$$

Variable $ISF_0$ is the internal switch factor of latch 510. Variable $C_0$ is the total capacitance at node 531. Variable $ISF_1$ is the internal switch factor of inverter 520. Variable $C_1$ is the total capacitance at node 532. Variable $d_1$ is the switch probability at the output of inverter 520 (1.0 for an inverter). Variable $ISF_2$ is the internal switch factor of NAND device 521. Variable $C_2$ is the total capacitance at node 533. Variable $d_2$ is the switch probability at the output of NAND device 521 (0.5 for a NAND device). All devices downstream from latch 510 are considered, up to, but not including, the next downstream sequential devices.

FIG. 8 illustrates six latches 810-816, and a plurality of non-sequential devices 820-832. The enable input of latch 810 is connected to node 890, the clock input is connected to node 891, the data input is connected to node 880, and the data output is connected to node 850. The data input of inverter 820 is connected to node 850 and its data output is connected to node 851. Node 851 is a branching node that is received by two devices. A data input of the complex gate 823 is connected to node 851 and its output is connected to node 861. Node 861 is also a branching node that is received by two devices. The data input of inverter 826 is connected to node 861 and its data output is connected to node 870. A data input of NAND device 827 is connected to node 870 and its data output is connected to node 871. A data input of NOR device 828 is connected to node 871 and its data output is connected to node 872. A data input of NAND device 829 is connected to node 872 and its data output is connected to node 873. The data input of latch 813 is connected to node 873 and its data output is connected to node 881. A data input of NAND device 824 is connected to the branching node 861 and its data output is connected to node 862. A data input of inverter 825 is connected to node 862 and its data output is connected to node 863. The data input of latch 812 is connected to node 863 and its data output is connected to node 882. A data input of NAND device 821 is connected to the branching node 851 and its data output is connected to node 852. A data input of NAND device 822 is connected to node 852 and its data output is connected to node 853. Node 853 is another branching node and is received by two devices. The data input of latch 811 is connected to node 853 and its data output is connected to node 883. The data input of inverter device 830 is connected to node 853 and its output is connected to node 854. Node 854 connects external to the circuit device at structure 829. Structure 829 can be a bond pad. The enable input of latch 814 is connected to node 890 (the same node connected to the enable input of latch 810). The data input of latch 814 is connected to node 840, its clock input is connected to node 891, and its data output is connected to node 841. The data input of inverter 831 is connected to node 841 and its output is connected to node 842. A data input of NAND device 832 is connected to node 842 and its data output connected to node 843. The data input of latch 815 is connected to node 843 and its data output is connected to node 844.

Still referring to FIG. 8, latches 810 and 814 and all of the depicted non-sequential devices are considered downstream of the sequential node 890. Latches 810 and 814, non-sequential devices 820-832, nodes 841-843, nodes 850-854, nodes 860-863, and nodes 870-873 will all be considered in the calculation of the effective switching capacitance for sequential node 890.

A generalized equation representing the calculation of the effective switching capacitance for the output node of a sequential device can be written as:

$$EC_{k,i} = (1 + ISF_0) * C_0 + \sum_{x=1}^{X_i} \sum_{y=0}^{Y_i} (1 + ISF_{x,y}) * C_{x,y} * d_{x,y}$$

$EC_{k,i}$ is the effective switching capacitance at a sequential node(k) and sequential device(i). Variable $ISF_0$ is the internal switch factor for sequential device(i). Variable $C_0$ is the total capacitance at the node connected to the data output of sequential device(i). The variables 'x' and 'y' represent the array of downstream devices that are included in the calculation of the total effective switching capacitance for sequential device(i). Using FIG. 8 as and example, the following mapping of the devices into this array can be accomplished as follows: The variable x can denote the depth downstream from the sequential device under evaluation. The variable y can enumerate the multiple branches in the interconnection of the non-sequential devices, if there are branches. For example, inverter 820 can be device(1,0), NAND device 821 can be device(2,0), complex device 823 can be device(2,1), NAND device 824 can be device(3,1), and inverter 826 can be device(3,2). Variable $ISF_{x,y}$ represents the Internal Switching Factor of device(x,y). Variable $C_{x,y}$ represents the total capacitance at the node connected to the data output of device (x,y). Variable $d_{x,y}$ represents the switch probability at the output of device(x,y). Variable d(0,y) represents the switch probability on the node connected to the output of the sequential device (such as node 850 in FIG. 8), and will be declared to have a value of 1.0. Referring to FIG. 8, the switch probability d at node 850 is 1.0, node 851 is 1.0, node 852 is 0.5, node 853 is 0.25, and node 854 is 0.25.

In one embodiment, an enabling signal can be utilized to prevent a portion of a design that is downstream of the enable node from being clocked, thereby reducing the switching activity, and therefore the power dissipation, of said portions. There is also a capacitance associated with the enabling node itself, or, in the case of the clock gater circuit, additionally the sum of the node capacitances associated with said clock gater circuit that switches when the enabling signal is active. The total of the aforementioned capacitances can be called the enable capacitance load, ECL. Referring to FIG. 4, the enable capacitance load that will contribute to the effective switching capacitance associated with node 120 includes the total capacitance at node 120. Referring to FIG. 5, the enable capacitance load includes the total capacitance at node 220 and node 240. Referring to FIG. 6, the enable capacitance load includes the total capacitance at nodes 330, 360, and 350. Referring to FIG. 8, the enable capacitance Load is the total capacitance at node 890.

The total effective switching capacitance associated with an enable signal, ECK, can be expressed by the equation:

$$EC_k = ECL_k + \sum_{i=0}^{M} EC_{k,i} * IA_i$$

$EC_k$ represents the weight associated to enable signal node 'k' that is enabling 'M' number of sequential devices. Variable $ECL_k$ represents the enable capacitance load of the enable signal node. Variable $EC_{k,i}$ represents the total effective switching capacitance at the data output of each sequential device(i). Variable $IA_i$ represents the input activity of the node connected to the data input of sequential device(i). The input activity is the switching probability of said data input. Referring to FIG. 8, nodes 880 and 840 would each have an IA parameter associated with them. A value for $IA_i$ can be assigned as a result of a variety of methods, including employing the methods contained in this disclosure, or can assigned a typical value such as a value in the range or 0.02-0.05. The value can be derived or de-rated based on the specific functionality of the block containing the sequential device.

By following the procedures disclosed herein, the total effective switching capacitance associated with each enable can be calculated. The total effective switching capacitance for the sum of all 'N' enables of a complete design, TotalCac, can be expressed by the following equation:

$$TotalCac = \sum_{k=0}^{N} (EC_k * A_k)$$

Variable $EC_k$ represents the effective switching capacitance associated with one enable signal, enable(k). Variable $A_k$ is the activity of enable(k) (the probability of the enable being in a logic-high state). The results of this calculation can be used as a figure of merit for the entire design.

Figure 9:
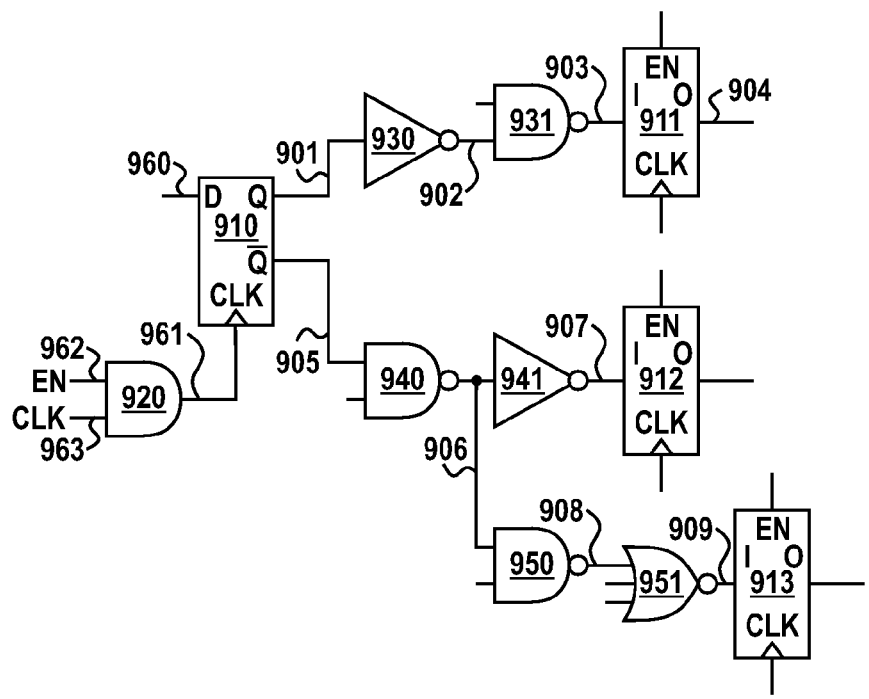
FIG. 9 illustrates a representative portion device representative device represented by a design file.

FIG. 9 is intended to illustrate how a single sequential device can possess more than one data output that can switch as a result of a clock event. The devices downstream from both of the sequential device's outputs are included when calculating the effective switching capacitance associated with said sequential device, such as when calculating the effective switching capacitance at nodes 962 and 961. Flip-flop 910 has a data input that is connected to node 960, a clock input that is connected to node 961, one data output that is connected to node 901 and another data output that is connected to node 905. One data input of AND device 920 is connected to node 962, the other data input is connected to node 963, and the data output is connected to node 961. The data input of inverter 930 is connected to node 901 and its output is connected to node 902. One data input of NAND device 931 is connected to node 902 and its data output is connected to node 903. The data input of latch 911 is connected to node 903 and its data output is connected to node 904. One data input of NAND device 940 is connected to node 905 and its data output is connected to node 906. Node 906 is a branching node and connects to two devices. The data input of inverter 941 is connected to node 906 and its output is connected to node 907. The data input of latch 912 is connected to node 907. One data input of NAND device 950 is connected to node 906 and its output is connected to node 908. One data input of NOR device 951 is connected to node 908 and its data output is connected to node 909. The data input of latch 913 is connected to node 909.

Again referring to FIG. 9, node 961 can be referred to as a gated clock node. The signal EN, provided to enable node 962, gates the clock signal CLK1, provided to node 963. Since the signal EN at enable node 962 gates a clock signal provided to sequential device 910, node 962 will be considered a sequential node associated with sequential device 910. Devices downstream from the enable node 962 that are considered when calculating the total effective switching capacitance for node 962 include AND device 920, and devices 910, 930-931, 940-941, and 950-951. Latch devices 911-913 are not considered in said calculation because they are sequential devices. The enable capacitance load, ECL, includes the total capacitance at nodes 962 and 961. The parameter IA, input activity, would apply to node 960. The switch probability, d, of nodes 901 and 902 will be assigned the value 1.0 since they connected directly to the output of a sequential device. It will be appreciated that the effective switching capacitance associated with a single latch output can be calculated. For example, the effective switching capacitance at node 905 will include only devices 940-941 and 950-951.

In one embodiment, a device downstream from a sequential node can be included or excluded when calculating the effective switching capacitance at the sequential node, based upon some criteria. For example, whether a downstream device is included can be based upon whether the device is within a defined downstream distance from the sequential node, referred to as the depth threshold. The exclusion of some devices can be done to minimize computation effort since it can be considered that devices further downstream then this depth threshold will not contribute significantly to the effective switching capacitance at the sequential node due to the low switching probability of said downstream devices. Downstream devices that are within the downstream depth threshold would be included in the effective switching capacitance calculation. Referring to FIG. 8, perhaps devices 828 and 829 can be excluded from consideration if they are further downstream then defined by the downstream depth threshold. Optionally, inverters can be excluded when determining the downstream depth of a device since the switch probability is not reduced at the output of an inverter device.

Another criteria by which a device downstream from a sequential node can be included or excluded when calculating the effective switching capacitance at said sequential node, can be the switching probability at the input of said downstream device. When the switching probability on the input of a device exceeds a defined switching probability, or threshold, then said device will be included in the calculation. When the switching probability on the input of a device is smaller than the defined switching probability value, then said device is excluded from the calculation since it can be considered that said downstream device will not contribute significantly to the effective switching capacitance at the upstream sequential node. Alternatively, a device whose input switching probability is smaller than the defined switching probability can still be included if the total capacitance on the output node of said device being evaluated is deemed significant, since the output node of said device can contribute significantly to the effective switching capacitance of the upstream sequential node even though the switching probability on the input of said device is small. The exclusion of some devices can be done to minimize computation effort with minimal loss in overall accuracy.

Early in the project development cycle, the information in the design file can be limited, and as the project progresses, the quantity and quality of the data in the design file improves yielding results with higher accuracy. Application of this disclosure is especially beneficial early in the project life since significant design decisions can be realized long before investing subsequent engineering resources. The methods disclosed do not require a completed design to yield highly useful results.

It will be understood that the specific methods herein, which can include and functions of specific module, will typically be executed at a data processor device such as a computer. Such methods may be in hardware, software, or combination thereof. For example, a specific method may be performed using software, which can include firmware, executed on one or more a processing modules.

Figure 10:
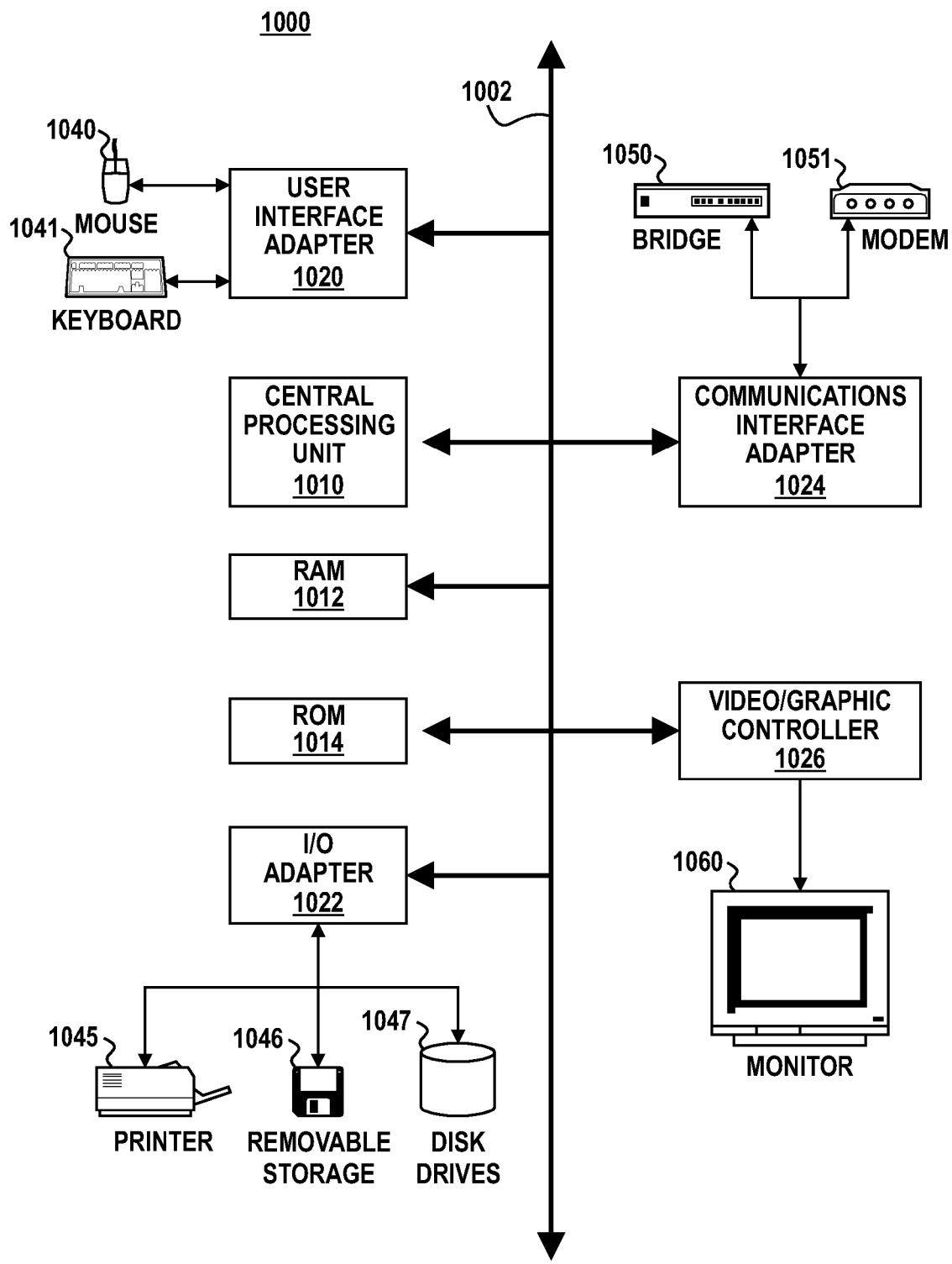
FIG. 10 represents a system capable of implementing the methods described herein.

FIG. 10 illustrates, in block diagram form, a processing device in the form of a computer system 1000. The computer system 1000 is illustrated to include devices connected to each other a central processing unit 1010, which may be a conventional proprietary data processor, memory including random access memory 1012, read only memory 1014, and input output adapter 1022, a user interface adapter 1020, a communications interface adapter 1024, and a multimedia controller 1026.

The input output (I/O) adapter 1026 is further connected to, and controls, disk drives 1047, printer 1045, removable storage devices 1046, as well as other standard and proprietary I/O devices.

The user interface adapter 1020 can be considered to be a specialized I/O adapter. The adapter 1020 is illustrated to be connected to a mouse 1040, and a keyboard 1041. In addition, the user interface adapter 1020 may be connected to other devices capable of providing various types of user control, such as touch screen devices.

The communications interface adapter 1024 is connected to a bridge 1050 such as is associated with a local or a wide area network, and a modem 1051. By connecting the system bus 1002 to various communication devices, external access to information can be obtained.

The multimedia controller 1026 will generally include a video graphics controller capable of displaying images upon the monitor 1060, as well as providing audio to external components (not illustrated).

Generally, the system 1000 will be capable of implementing the system and methods described herein. For example, the design file to be analyzed by the method described herein can be stored at disk drive 1047 and accessed by the CPU 1010 in response to an instruction.

Note that not all of the activities described above in the general description or the examples are required, that a portion of a specific activity may not be required, and that one or more further activities may be performed in addition to those described. Still further, the order in which activities are listed are not necessarily the order in which they are performed.

After reading this specification, skilled artisans will be capable of determining what activities can be used for their specific needs or desires.

In the foregoing specification, principles of the invention have been described above in connection with specific embodiments. However, one of ordinary skill in the art appreciates that one or more modifications or one or more other changes can be made to any one or more of the embodiments without departing from the scope of the invention as set forth in the claims below. Accordingly, the specification and figures are to be regarded in an illustrative rather than a restrictive sense and any and all such modifications and other changes are intended to be included within the scope of invention.

Any one or more benefits, one or more other advantages, one or more solutions to one or more problems, or any combination thereof have been described above with regard to one or more specific embodiments. However, the benefit(s), advantage(s), solution(s) to problem(s), or any element(s) that may cause any benefit, advantage, or solution to occur or become more pronounced is not to be construed as a critical, required, or essential feature or element of any or all the claims.

What is claimed is:

1. A computer implemented method comprising:
    identifying a plurality of sequential nodes in a design file, wherein the design file represents an electronic device, each sequential node of the plurality of sequential nodes is to receive an enable signal that gates a clock signal provided to a respective sequential device, the enable signal to enable or disable propagation of information through the respective sequential device;
    determining an effective switching capacitance for a first sequential node of the plurality of sequential nodes based upon statically predicted operation of a first device wherein:
    determining the effective switching capacitance for the first sequential node based upon the statically predicted operation of the first device is in response to determining that the first device is within a defined downstream distance of the first sequential node; and
    determining the effective switching capacitance for the first sequential node based upon the statically predicted operation of the second device downstream from the first sequential node in response to determining that the second device is within the defined downstream distance of the first sequential node, wherein the effective switching capacitance of the first sequential node is not based upon the statically predicted operation of the second device when the second device is not within the defined downstream distance of the first sequential node downstream from the first sequential node and of a second device downstream from the first device;
    storing the effective switching capacitance for the first sequential node; and
    repeating determining the effective switching capacitance for each other sequential node of the plurality of sequential nodes.

2. The method of claim 1, wherein the first device is a nonsequential device.

3. The method of claim 1, wherein the first device is a sequential device having a clock input to receive a clock signal gated by the first sequential node.

4. The method of claim 3, wherein determining the effective switching capacitance is further based upon statically predicted operation of a third device downstream from the second device, wherein the second device and the third device are nonsequential devices.

5. The method of claim 3, wherein the second device is downstream from a first output of the first device, and
    determining the effective switching capacitance is further based upon statically predicted operation of a third device downstream from a second output of the first device.

6. The method of claim 5, where determining the effective switching capacitance is further based upon statically predicted operation of a fourth device downstream from the third device.

7. The method of claim 1 further comprising:
    determining the effective switching capacitance for the first sequential node based upon statically predicted operation of the second device downstream from the first device in response to determining that a switching probability of the first device is greater than a defined switching probability.

8. The method of claim 7, where the effective switching capacitance of the first sequential node is not based upon the statically predicted operation of the second device when the switching probability of the first device is less than the defined switching probability.

9. The method of claim 1 further comprising:
    performing an operation on the first device based on the effective switching capacitance of the first sequential node.

10. The method of claim 9, wherein performing the operation comprises performing a layout operation on the first device prior to a third device in response to the effective switching capacitance of the first sequential node being greater than an effective switching capacitance of a second sequential node, where the third device is downstream of the second sequential node and is not downstream of the first sequential node.

11. The method of claim 8, wherein the layout operation is a device placement operation.

12. The method of claim 8, wherein the layout operation is a routing operation.

13. The method of claim 8, wherein the layout operation is a device floor planning operation.

14. The method of claim 1, where determining the effective switching capacitance occurs prior to placement of the first device.

15. The method of claim 1, where determining the effective switching capacitance occurs prior to routing of the first device.

16. A system comprising a data processor operable to execute a set of instructions to:
    access a design file representing an electronic device;
    identify a plurality of sequential nodes in the design file where each sequential node of the design file is an input or output of a respective sequential device or a node that gates a signal provided to a respective sequential device to enable or disable propagation of information through the sequential device;
    determine an effective switching capacitance for a first sequential node of the plurality of sequential nodes based upon statically predicted operation of a first device downstream from the first sequential node and of a second device downstream from the first device, wherein:
    determining the effective switching capacitance for the first sequential node based upon the statically predicted operation of the first device is in response to determining that the first device is within a defined downstream distance of the first sequential node; and
    determining the effective switching capacitance for the first sequential node based upon the statically predicted operation of the second device downstream from the first sequential node in response to determining that the second device is within the defined downstream distance of the first sequential node, where the effective switching capacitance of the first sequential node is not based upon the statically predicted operation of the second device when the second device is not within the defined downstream distance of the first sequential node, the statically predicted operation of the first device including a switching factor based upon how efficiently an output of the first device switches;

store the effective switching capacitance for the first sequential node; and repeat determining and storing the effective switching capacitance for each other sequential node of the plurality of sequential nodes.

17. A computer readable medium storing instructions operable to control operation of a data processor to:

access a design file representing an electronic device;

identify a plurality of sequential nodes in the design file where each sequential node of the design file is an input or output of a respective sequential device or a node that receives an enable signal that gates a clock signal provided to a respective sequential device to enable or disable propagation of information through the sequential device;

in response to determining a first device is within a defined downstream distance from a first sequential node of the plurality of sequential nodes, determining an effective switching capacitance for the first sequential node based upon statically predicted operation of the first device, and in response to determining a second device downstream from the first device is within the defined downstream distance from the first sequential node, determining the effective switching capacitance for the first sequential node is further based upon statically predicted operation of the second device;

store the effective switching capacitance for the first sequential node; and repeat determining and storing the effective switching capacitance for each other sequential node of the plurality of sequential nodes.

18. The computer readable medium of claim 17 further comprising instructions to select one of the sequential nodes, based upon its effective switching capacitance, and to initiate a layout operation on the selected sequential nodes in response to its selection.

* * * * *